(12) United States Patent
Maxwell et al.

(10) Patent No.: US 8,866,124 B2
(45) Date of Patent: Oct. 21, 2014

(54) DIODES WITH NATIVE OXIDE REGIONS FOR USE IN MEMORY ARRAYS AND METHODS OF FORMING THE SAME

(75) Inventors: Steven Maxwell, Sunnyvale, CA (US); Abhijit Bandyopadhyay, San Jose, CA (US); Kun Hou, Milpitas, CA (US); Er-Xuan Ping, Fremont, CA (US); Yung-Tin Chen, Santa Clara, CA (US); Li Xiao, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 371 days.

(21) Appl. No.: 13/020,007

(22) Filed: Feb. 2, 2011

(65) Prior Publication Data

US 2012/0193756 A1   Aug. 2, 2012

(51) Int. Cl.
*H01L 47/00* (2006.01)
*H01L 29/868* (2006.01)
*H01L 27/102* (2006.01)

(52) U.S. Cl.
CPC .......... *H01L 27/1021* (2013.01); *H01L 29/868* (2013.01); *Y10S 438/90* (2013.01)
USPC ................................... 257/5; 257/1; 438/900

(58) Field of Classification Search
USPC ....................................................... 257/1–5
See application file for complete search history.

(56) References Cited

U.S. PATENT DOCUMENTS

| | | | |
|---|---|---|---|
| 4,631,560 A | 12/1986 | Calviello | |
| 4,692,997 A | 9/1987 | Calviello | |
| 5,792,569 A | 8/1998 | Sun et al. | |
| 5,915,167 A | 6/1999 | Leedy | |
| 6,952,030 B2 | 10/2005 | Herner et al. | |
| 7,265,049 B2 | 9/2007 | Herner et al. | |
| 7,648,896 B2 | 1/2010 | Herner | |
| 7,812,404 B2 | 10/2010 | Herner et al. | |
| 2006/0035463 A1* | 2/2006 | Crank et al. | 438/683 |
| 2006/0250836 A1* | 11/2006 | Herner et al. | 365/148 |
| 2009/0309096 A1 | 12/2009 | Iwasaki | |

FOREIGN PATENT DOCUMENTS

JP  2006-140487  6/2006

OTHER PUBLICATIONS

Chen et al., U.S. Appl. No. 12/904,770, filed Oct. 14, 2010.
S. Brad Herner, U.S. Appl. No. 11/692,151, filed Mar. 27, 2007.
Asuha, T. et al. "Ultrathin silicon dioxide layers with a low leakage current density formed by chemical oxidation of Si", Applied Physics Letters, vol. 81, No. 18 (Oct. 28, 2002), 3410-3412.
Ellis, K. A. et al. "Phosphorus Diffusion in Silicon Oxide and Oxynitride Gate Dielectrics", Electrochem, Sol. St. Lett. 2, (1999), 516-518.
Hamada, T. et al., "Thin Inter-Polyoxide Films for Flash Memories Grown at Low Temperature (400°) by Oxygen Radicals", IEEE Elect. Dev. Lett. vol. 22, No. 9, (Sep. 2001), 423-425.

(Continued)

*Primary Examiner* — Benjamin Sandvik
(74) *Attorney, Agent, or Firm* — Vierra Magen Marcus LLP (57) ABSTRACT

In a first aspect, a vertical semiconductor diode is provided that includes (1) a first semiconductor layer formed above a substrate; (2) a second semiconductor layer formed above the first semiconductor layer; (3) a first native oxide layer formed above the first semiconductor layer; and (4) a third semiconductor layer formed above the first semiconductor layer, second semiconductor layer and first native oxide layer so as to form the vertical semiconductor diode that includes the first native oxide layer. Numerous other aspects are provided.

28 Claims, 10 Drawing Sheets

(56) References Cited

OTHER PUBLICATIONS

Malhotra, Vinod., et al., "An Electrothermal Model of Memory Switching in Vertical Polycrystalline Silicon Structures", IEEE Transactions on Electron Devices, vol. 35, 9, (Sep. 1988), 1514-1523.

Nutzel, J.F., et al., "Comparison of P and Sb as n-dopants for Si molecular beam epitaxy", J. Appl. Phys. 78 (2), (Jul. 15, 1995), 937-940.

Park, B., et al., "Study of contact resistance in in-situ phosphorus layer doped Si deposition process", Electrochemical Society Proceedings 99-31, (1999), 34-45.

Raider, S. I. et al., "Abstract: Stoichiometry of SiO2/Si interfacial regions: I. Ultrathin oxide films", J. Vac. Sci. Tech. vol. 13, No. 1, (Jan./Feb. 1976), 58.

Singh, D V., et al., "Abrupt phosphorus profiles in Si: Effects of temperature and substitutional carbon on phosphorus autodoping", Journal of the Electrochemical Society, 150, (2003) G553-G556.

* cited by examiner

DIODES WITH NATIVE OXIDE REGIONS FOR USE IN MEMORY ARRAYS AND METHODS OF FORMING THE SAME

FIELD OF THE INVENTION

The present invention relates to memory arrays, and more particularly to diodes with native oxide regions for use in memory arrays and methods of forming the same.

BACKGROUND OF THE INVENTION

Reversible resistivity-switching (RRS) materials may be used as storage elements in memory arrays. For example, U.S. Pat. No. 7,812,404, filed May 9, 2005 and titled "NON-VOLATILE MEMORY CELL COMPRISING A DIODE AND A RESISTANCE-SWITCHING MATERIAL", which is hereby incorporated by reference herein in its entirety, describes a rewriteable non-volatile memory cell that includes a diode coupled in series with an RRS material such as a metal oxide or metal nitride.

Modulation of the resistivity of metal oxide and other RRS materials requires use of voltages and/or currents that may be difficult to achieve efficiently with conventional diodes, particularly when large arrays of RRS material storage elements are employed (e.g., such as when a low leakage current is desired for "unselected" storage elements in the array). Accordingly, a need exists for diodes with I-V characteristics that are compatible with metal oxide or other RRS material storage elements and/or arrays, and for methods of forming such diodes.

SUMMARY

In a first aspect of the invention, a vertical semiconductor diode is provided that includes (1) a first semiconductor layer formed above a substrate; (2) a second semiconductor layer formed above the first semiconductor layer; (3) a first native oxide layer formed above the first semiconductor layer; and (4) a third semiconductor layer formed above the first semiconductor layer, second semiconductor layer and first native oxide layer so as to form the vertical semiconductor diode that includes the first native oxide layer.

In a second aspect of the invention, a memory cell is provided that includes (1) a first conductive layer formed above a substrate; (2) a storage element formed above the first conductive layer; (3) a vertical semiconductor diode formed above the first conductive layer, the vertical semiconductor diode having (a) a first semiconductor layer formed above the first conductive layer; (b) a second semiconductor layer formed above the first semiconductor layer; (c) a first native oxide layer formed above the first semiconductor layer; and (d) a third semiconductor layer formed above the first semiconductor layer, second semiconductor layer and first native oxide layer so as to form the vertical semiconductor diode that includes the first native oxide layer; and (4) a second conductive layer formed above the first conductive layer, the storage element and the vertical semiconductor diode.

In a third aspect of the invention, a method of forming a semiconductor diode is provided that includes (1) forming a first semiconductor layer above a substrate; (2) forming a second semiconductor layer above the first semiconductor layer; (3) forming a first native oxide layer above the first semiconductor layer; and (4) forming a third semiconductor layer above the first semiconductor layer, second semiconductor layer and first native oxide layer so as to form the semiconductor diode that includes the first native oxide layer.

In a fourth aspect of the invention, a method of forming a memory cell is provided that includes (1) forming a first conductive layer above a substrate; (2) forming a storage element above the first conductive layer; (3) forming a vertical semiconductor diode above the first conductive layer by (a) forming a first semiconductor layer above the first conductive layer; (b) forming a second semiconductor layer above the first semiconductor layer; (c) forming a first native oxide layer above the first semiconductor layer; and (d) forming a third semiconductor layer above the first semiconductor layer, second semiconductor layer and first native oxide layer so as to form the vertical semiconductor diode that includes the first native oxide layer; and (4) forming a second conductive layer above the first conductive layer, the storage element and the vertical semiconductor diode. Numerous other aspects are provided.

Other features and aspects of this invention will become more fully apparent from the following detailed description, the appended claims and the accompanying drawings.

DETAILED DESCRIPTION

Figure 1:
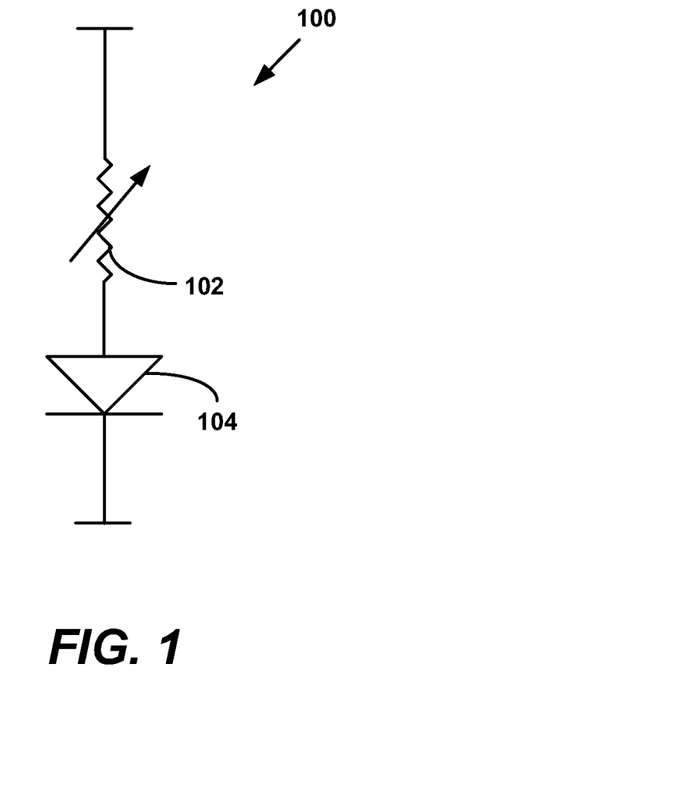
FIG. 1 is a schematic illustration of an exemplary memory cell in accordance with this invention.

As stated, a memory cell may be formed from a reversible-resistivity switching (RRS) material in series with a diode or other steering element. FIG. 1 is a schematic illustration of an exemplary memory cell 100 in accordance with this invention having an RRS material 102 coupled in series with a diode 104.

RRS material 102 has a resistivity that may be reversibly switched between two or more states by application of the appropriate voltage (s) and/or current(s). Exemplary RRS materials include $HfO_X$, $ZrO_X$, $NiO_X$, $TiO_X$, $TaO_X$, $NbO_X$, $Al_XO_Y$, another metal oxide ($MO_X$) layer, or another suitable switching material. For example, some carbon-based materials exhibit reversible resistivity switching properties such as amorphous carbon containing nanocrystalline graphene (referred to herein as "graphitic carbon"), graphene, graphite, carbon nano-tubes, amorphous diamond-like carbon ("DLC"), silicon carbide, boron carbide and other crystalline forms of carbon, which may include secondary materials.

Diode 104 may include a p-n, n-p, p-i-n or n-i-p diode, a punch-through diode, or another similar steering element that exhibits non-ohmic conduction by selectively limiting the voltage across and/or the current flow through RRS material 102. In this manner, memory cell 100 may be used as part of a two or three dimensional memory array and data may be written to and/or read from memory cell 100 without affecting the state of other memory cells in the array. In some embodiments, diode 104 may be located remotely from the RRS material 102.

In accordance with the present invention, a native oxide is formed in one or more regions of the diode 104 to modulate the I-V characteristics of the diode 104 (such as reverse leakage current as described further below). Such modulation may provide an I-V characteristic that is more suitable for driving an RRS-material based memory cell and/or memory array.

Exemplary embodiments of the diode 104 are described below with reference to FIGS. 2A-5. Exemplary memory cells and arrays are described below with reference to FIGS. 6A-6E.

Exemplary Embodiments of Diodes

Figure 2A:
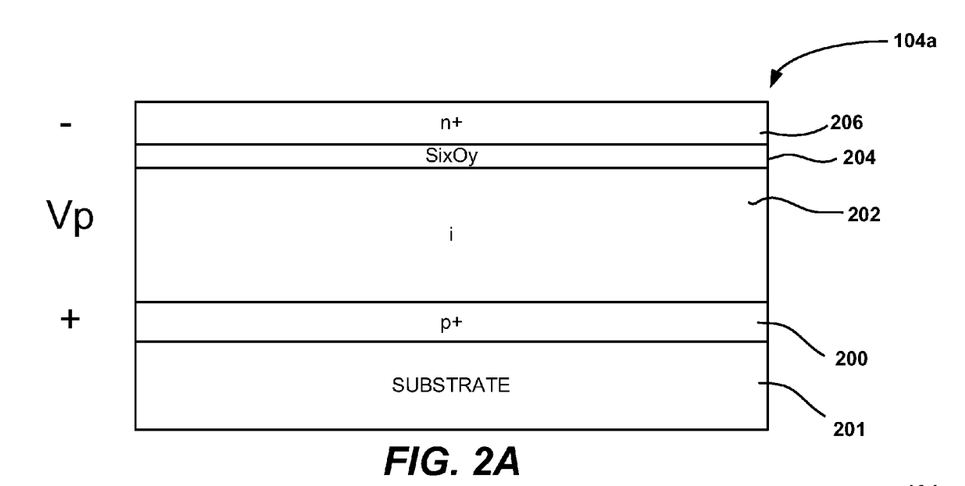
FIGS. 2A-2B illustrate a first exemplary diode provided in accordance with the present invention.

FIG. 2A illustrates a first exemplary diode 104a provided in accordance with the present invention. In the embodiment of FIG. 2A, the diode 104a is formed from a polycrystalline semiconductor material such as polysilicon, a polycrystalline silicon-germanium alloy, polygermanium or any other suitable material. For example, a heavily doped amorphous or polycrystalline p+ silicon layer 200 may be deposited on a suitable substrate 201. Chemical vapor deposition (CVD) or another suitable process may be employed to deposit p+ silicon layer 200. In at least one embodiment, p+ silicon layer 200 may be formed, for example, from about 40 to about 1000 angstroms, and in some embodiments about 50-100 angstroms, of p+ silicon with a doping concentration of about $10^{21}$ cm$^3$. Other layer thicknesses and/or doping concentrations may be used. P+ silicon layer 200 may be doped in situ, for example, by flowing an acceptor gas during deposition, or ex situ, for example, via implantation.

After deposition of p+ silicon layer 200, a lightly doped, intrinsic and/or unintentionally doped amorphous or polycrystalline silicon layer 202 may be formed over p+ silicon layer 200. CVD or another suitable deposition method may be employed to deposit intrinsic silicon layer 202. In at least one embodiment, intrinsic silicon layer 202 may be about 500 to about 4800 angstroms, and in some embodiments about 750 angstroms, in thickness. Other intrinsic layer thicknesses may be used.

Following formation of intrinsic silicon layer 202, a native oxide layer 204 is formed over intrinsic layer 202. As used herein, a "native oxide" refers to an oxide that forms on a surface of a semiconductor layer when the semiconductor layer is exposed to an oxidizing species in ambient conditions. Ambient conditions may include "room" conditions such as room air, room temperature and/or room pressure if the semiconductor layer is exposed to such room conditions. Alternatively, ambient conditions may include the ambient conditions present in a process chamber to which the semiconductor layer is exposed following formation of the semiconductor layer. In such cases, supplemental oxygen and/or another oxidizing species may be introduced into the process chamber following semiconductor layer formation to assist in formation of a native oxide layer. However, as used herein, a native oxide does not refer to a thermal oxide formed on a semiconductor layer by adding thermal energy in excess of ambient conditions, or to a chemically grown oxide formed by immersing the semiconductor layer in a wet chemical bath such as $H_2O_2$ or $NH_4OH$ as described, for example, in U.S. Pat. No. 7,265,049 titled "ULTRATHIN CHEMICALLY GROWN OXIDE FILM AS A DOPANT DIFFUSION BARRIER IN SEMICONDUCTOR DEVICES" which is hereby incorporated by reference herein in its entirety for all purposes.

As will be described further below, the native oxide layer 204 may be formed by exposing the intrinsic silicon layer 202 to an oxidizing species such as oxygen, clean dry air (CDA), nitrous oxide, etc., either within the deposition chamber used to deposit the intrinsic silicon layer 202 or in another chamber (e.g., using ambient conditions). Alternatively, the native oxide layer 204 may be formed by exposing the intrinsic silicon layer 202 to room conditions such as room temperature, room air, room pressure, or the like, such as by removing the substrate 201 on which the diode 104a is being formed from the deposition chamber used to deposit the intrinsic silicon layer 202. In some embodiments, the intrinsic silicon layer 202 may be exposed to room conditions such as typical clean room temperature, air and/or pressure for about 10 to about 5760 minutes to form the native oxide layer 204, although other parameters may be used. For example, in some embodiments, the intrinsic silicon layer 202 may be exposed to room conditions such as typical clean room temperature, air and/or pressure for longer time periods such as 1, 2, 5, 10 or more days to form the native oxide layer 204.

Figure 2B:
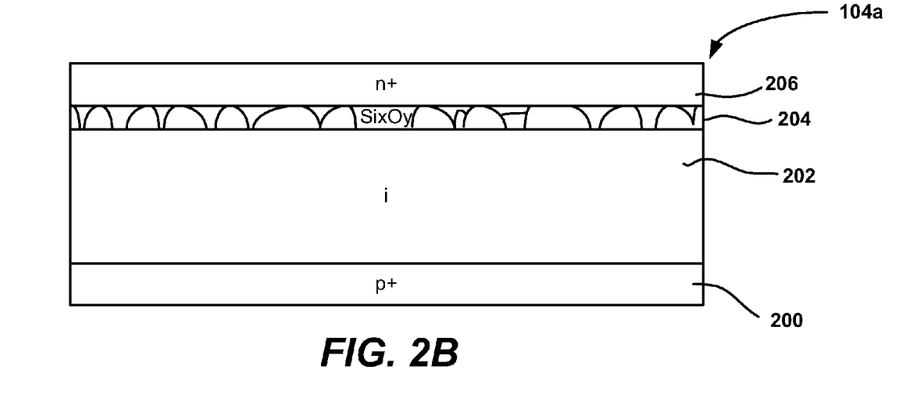

In some embodiments, the native oxide layer 204 may be a continuous film as shown in FIG. 2A. Alternatively, the native oxide layer 204 may be discontinuous as shown in FIG. 2B. In general, the native oxide layer 204 may be a poor quality (e.g., leaky) $Si_xO_y$ film having sufficient current leakage to allow desired current flow through the diode 104a. For example, the higher the quality of the native oxide layer 204, the thinner the native oxide layer 204 may be so as to allow current flow. In some embodiments, the native oxide layer 204 may have a thickness of less than about 25 angstroms, in some embodiments about 1 to 20 angstroms, and in some embodiments about 10-14 angstroms. Other native oxide layer thicknesses may be used.

Following formation of the native oxide layer 204, additional silicon may be deposited and doped by ion implantation or doped in situ during deposition to form an n+ silicon layer 206. Further, in some embodiments, a diffusion process may be employed. In at least one embodiment, the resultant n+ silicon layer 206 may have a thickness of about 40 to about 1000 angstroms, and in some embodiments about 50-100 angstroms, with a doping concentration of about $10^{21}$ cm$^{-3}$. Other layer thicknesses and/or doping concentrations may be used.

In at least one embodiment, a crystallization anneal may be performed to convert amorphous silicon to polysilicon or to otherwise improve the crystalline structure of the semiconductor material used to form the diode. For example, a crystallization anneal for about 10 seconds to about 2 minutes in nitrogen at a temperature of about 600 to 800° C., and in some embodiments between about 650 and 750° C., may be employed. Other annealing times, temperatures and/or environments may be used.

The presence of the native oxide layer 204 within the diode 104a may modulate the I-V characteristics of the diode 104a compared to a diode without the native oxide layer 204. For example, FIG. 3 illustrates I-V characteristics 300 for four diodes, two without a native oxide layer (curves 302a and 302b) and two with a native oxide layer (curves 304a and 304b) of about 10-14 angstroms as described below in TABLE 1:

TABLE 1

| I-V CURVE | DIODE HEIGHT (ANGSTROMS) | NATIVE OXIDE PRESENT? |
|---|---|---|
| 302a | 1000 | NO |
| 304a | 1000 | YES |
| 302b | 850 | NO |
| 304b | 800 | YES |

Figure 3:
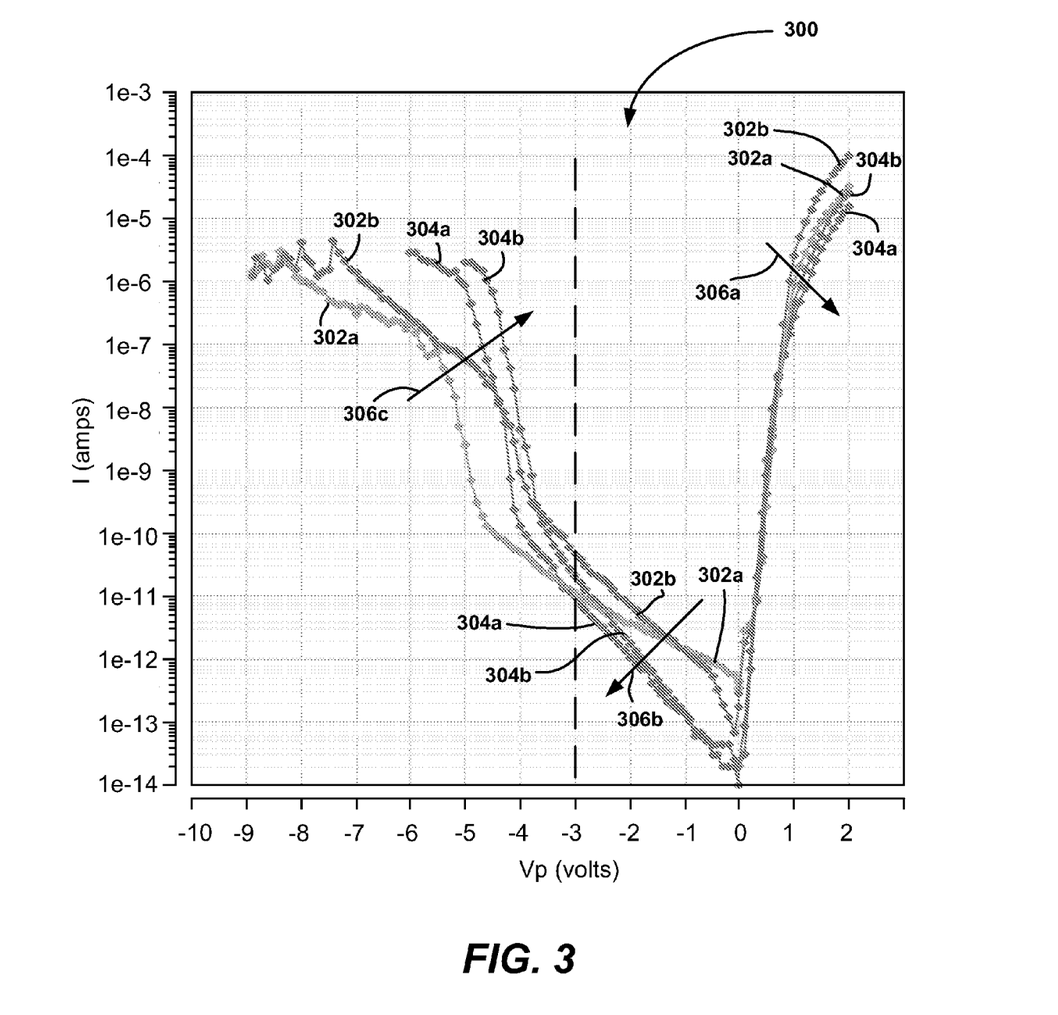
FIG. 3 illustrates I-V characteristics for four diodes, two without a native oxide layer and two with a native oxide layer in accordance with the present invention.

With reference to curves 302a and 304a in FIG. 3, diodes having a height of approximately 1000 angstroms were fabricated without a native oxide layer (curve 302a) and with a native oxide layer (curve 304a). As can be seen, the diode with the native oxide layer (curve 304a) exhibits reduced reverse current between about −3 and 0 volts relative to the diode without the native oxide layer (curve 302a). At reverse-bias voltages beyond −3 volts, the diode without the native oxide layer (curve 302a) exhibits reduced reverse current relative to the diode with the native oxide layer (curve 304a). A slight decrease in forward current is also observed when a native oxide layer is present (curve 304a).

With reference to curves 302b and 304b, diodes having heights of approximately 800-850 angstroms were fabricated without a native oxide layer (curve 302b) and with a native oxide layer (curve 304b). As can be seen, the diode with the native oxide layer (curve 304b) exhibits reduced reverse current between about −3 and 0 volts relative to the diode without the native oxide layer (curve 302b). At reverse-bias voltages beyond about −3.5 volts, the diode without the native oxide layer (curve 302b) exhibits reduced reverse current relative to the diode with the native oxide layer (curve 304b). A slight decrease in forward current is also observed when a native oxide layer is present (curve 304b).

To summarize, adding a native oxide layer within a diode stack may slightly decrease forward current of the diode (arrow 306a), decrease initial reverse leakage current of the diode (arrow 306b) and increase reverse leakage current of the diode when the diode is more heavily reverse biased (arrow 306c). Such modulation of I-V characteristics of a diode may be favorable for use within a memory array, particularly when the memory array employs RRS materials. For example, during a set or reset operation of a memory cell using reverse biasing, such as a memory cell employing a diode stack with a critical dimension (CD) of about 65 nanometers and a height of about 800-1000 nanometers, the memory cell may be exposed to a voltage of at least about 4-5 volts or higher (reverse bias) during a set or reset operation of the memory cell's RRS material. Because a diode with a native oxide layer present may conduct more current in such voltage ranges, a smaller bias voltage may be employed to supply the same current to the RRS material to be switched (relative to a diode without a native oxide layer). Additionally, any memory cells not being set or reset in a memory array are typically reverse biased at a voltage of about −3 volts or less. Because the reverse leakage current of diodes with native oxide layers present may be lower in this voltage range, the overall leakage current of the memory array due to unselected (or half selected) memory cells may be reduced by using diodes with native oxide layers relative to what would be observed if diodes without native oxide layers were employed within the memory array. The slight degradation in forward current of diodes with native oxide layers may be inconsequential for most applications. In some embodiments, a reverse leakage current as low as about 10 picoAmps at about −3 volts and a reverse leakage current above about 1 microAmp at about −4.5 to −5 volts have been observed for diodes with native oxide layers as described herein (e.g., for 65 nanometer CD diode stacks with heights of about 800-1000 angstroms).

While not wishing to be bound by any particular theory, it is believed that the observed changes in I-V characteristics of diode 104a may be due to native oxide layer 204 affecting the thickness of the top semiconductor layer 206 (n+ layer 206 in FIG. 2A). For example, the native oxide layer 204 may confine the semiconductor junction between semiconductor layers 202 and 206 and reduce diffusion of n-type dopant (e.g., phosphorus) into the intrinsic layer 202 from n+ layer 206. This may result in an effectively thinner n+ layer 206.

Additional Diode Embodiments

Figure 4A:
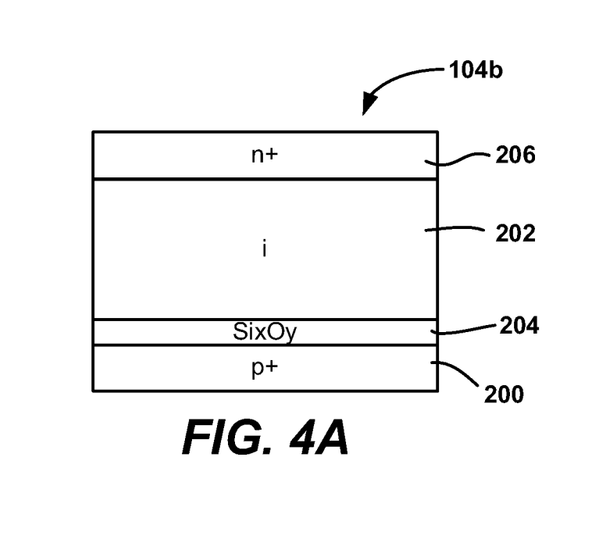
FIGS. 4A-4H illustrate alternative embodiments of the diode of FIG. 2A in accordance with the present invention.

FIG. 4A illustrates a first alternative embodiment of the diode 104a of FIG. 2A referred to as diode 104b in FIG. 4A. The diode 104b of FIG. 4A is similar to the diode 104a of FIG. 2A, with the exception that in the diode 104b of FIG. 4A, the native oxide layer 204 is formed on the bottom p+ silicon layer 200 rather than on the intrinsic layer 202 as in diode 104a of FIG. 2A.

The native oxide layer 204 of the diode 104b may be formed by exposing the p+ silicon layer 200 to an oxidizing species, either within the deposition chamber used to deposit the p+ silicon layer 200 or in another chamber (e.g., using ambient conditions). Alternatively, the native oxide layer 204 may be formed by exposing the p+ silicon layer 200 to room conditions, such as by removing the substrate (not shown) on which the diode 104b is being formed from the deposition chamber used to deposit the p+ silicon layer 200.

In some embodiments, the native oxide layer 204 may have a thickness of less than about 25 angstroms, in some embodiments a thickness of about 1 to 20 angstroms, and in some embodiments about 10-14 angstroms. Other native oxide layer thicknesses may be used.

Figure 4B:
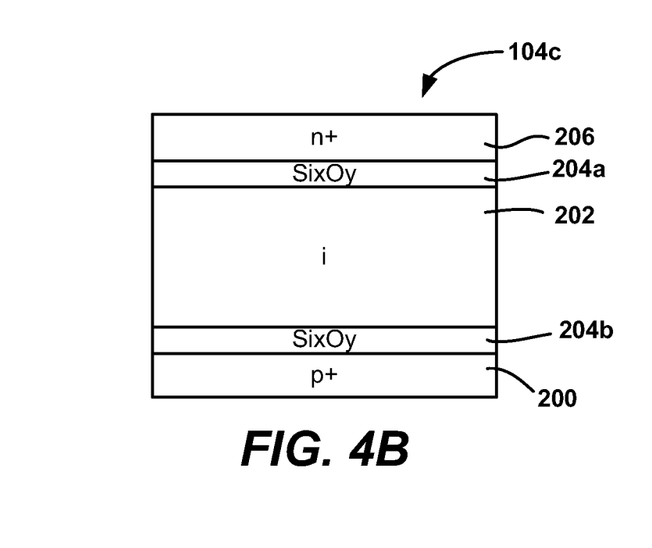

FIG. 4B illustrates a second alternative embodiment of the diode 104a of FIG. 2A referred to as diode 104c in FIG. 4B. The diode 104c of FIG. 4B is similar to the diode 104a of FIG. 2A, with the exception that the diode 104c of FIG. 4B includes a first native oxide layer 204a formed on intrinsic layer 202 (as in the diode 104a of FIG. 2A) and a second native oxide layer 204b formed on the bottom p+ silicon layer 200 (as in the diode 104b of FIG. 4A).

Each native oxide layer 204a or 204b of the diode 104c may be formed by exposing its respective silicon layer 200 or 202 to an oxidizing species, either within a silicon deposition or other chamber or by exposing the respective silicon layer 200 or 202 to room conditions, such as by removing the substrate (not shown) on which the diode 104c is being formed from the deposition chamber used to deposit the p+ silicon layer 200 and/or intrinsic layer 202. Different oxidation techniques may be used for the native oxide layers 204a and 204b if desired.

In some embodiments, the total thickness of the native oxide layer 202a plus the native oxide layer 202b may be about 25 angstroms or less, in some embodiments about 1 to 20 angstroms, and in some embodiments about 10-14 angstroms. Other total native oxide layer thicknesses may be used. The native oxide layers 202a and 202b may have the same, similar or different thicknesses.

Figure 4C:
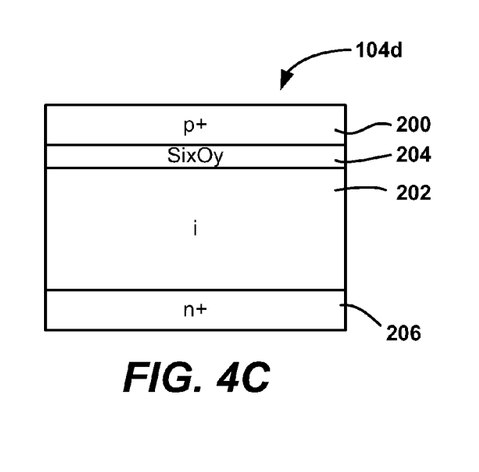
Figure 4D:
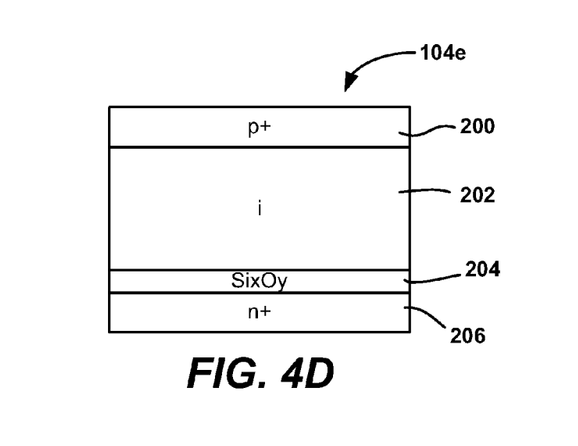
Figure 4E:
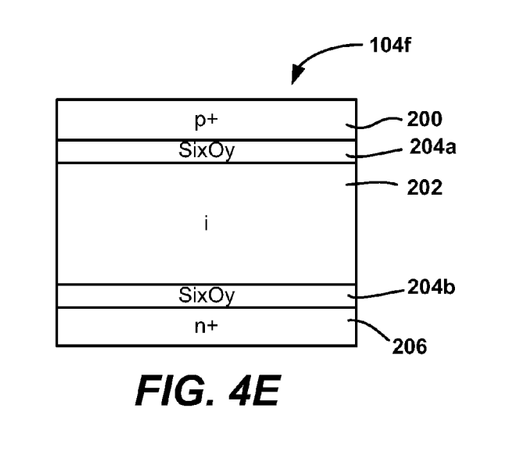

FIGS. 4C-4E illustrate alternative embodiments of the diodes 104a-c of FIGS. 2A, 4A and 4B, referred to as diodes 104d-f in FIGS. 4C-4E, in which the positions of p+ silicon layer 200 and n+ silicon layer 206 are reversed as shown. Specifically, the diodes 104a-c of FIGS. 2A, 4A and 4B are "upward pointing" diodes with p+ regions below n+ regions, whereas the diodes 104d-f of FIGS. 4C-4E are "downward pointing" diodes with n+ regions below p+ regions (as shown).

In diode 104d of FIG. 4C, the native oxide layer 204 is positioned between intrinsic layer 202 and top p+ layer 200; in diode 104e of FIG. 4D, the native oxide layer 204 is positioned between intrinsic layer 202 and bottom n+ layer 206; and in diode 104f of FIG. 4E, native oxide layers 204a and 204b are positioned between top p+ layer 200 and intrinsic layer 202 and bottom n+ layer 206 and intrinsic layer 202, respectively (as shown). In some embodiments, formation methods and/or oxide layer thicknesses similar to those employed for the diodes 104a-c of FIGS. 2A, 4A and 4B may be used for the diodes 104d-f of FIGS. 4C-4E.

Figure 4F:
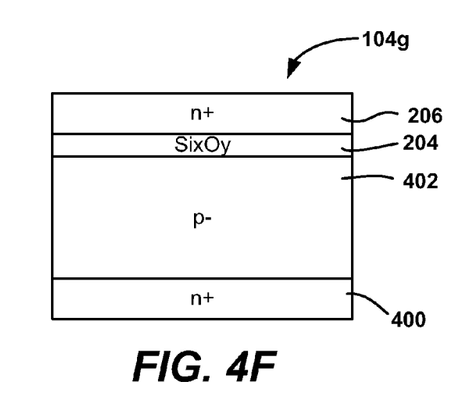
Figure 4G:
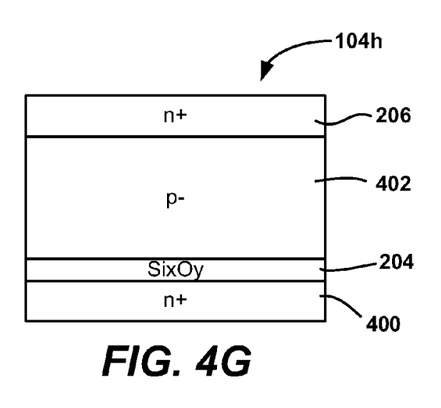
Figure 4H:
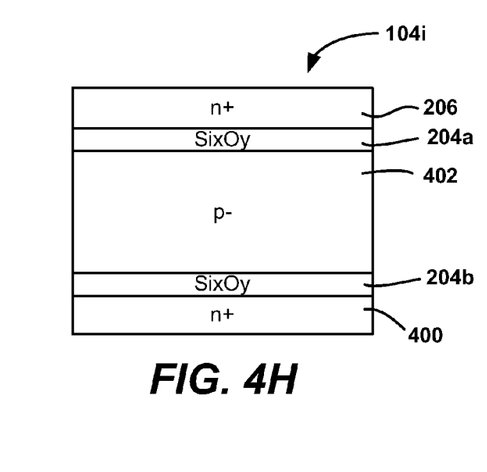

FIGS. 4F-4H illustrate alternative embodiments of the diodes 104a-c of FIGS. 2A, 4A and 4B, referred to as diodes 104g-i in FIGS. 4F-4H, in which bottom p+ layer 200 and intrinsic layer 202 of FIGS. 2A, 4A and 4B are replaced with bottom n+ layer 400 and central p− layer 402 in the diodes 104g-i of FIGS. 4F-4H. In this manner, n-p-n punch through diodes are formed. In some embodiments, bottom n+ layer 400 may be similar to top n+ layer 206 (e.g., in terms of thickness, doping, etc.). Central p− layer 402 may have a thickness of about 500 to about 4800 angstroms, preferably about 750 angstroms, and a doping concentration of about $1 \times 10^{18}$ to $1 \times 10^{19}$ cm$^{-3}$. Other thicknesses and doping concentrations may be used.

In diode 104g of FIG. 4F, the native oxide layer 204 is positioned between p− layer 402 and top n+ layer 206; in diode 104h of FIG. 4G, the native oxide layer 204 is positioned between p− layer 402 and bottom n+ layer 400; and in diode 104i of FIG. 4H, native oxide layers 204a and 204b are positioned between top n+ layer 206 and p− layer 402 and bottom n+ layer 400 and p− layer 402, respectively (as shown). In some embodiments, formation methods and/or oxide layer thicknesses similar to those employed for the diodes 104a-c of FIGS. 2A, 4A and 4B may be used for the diodes 104g-i of FIGS. 4F-4H.

In yet other embodiments of the invention, p-n-p punch through diodes may be similarly formed with one or more native oxide layers formed therein as described above. For example, a p-n-p diode may have a native oxide layer formed between one or both p-n interfaces of a p-n-p diode.

Exemplary Process for Forming Diodes

Figure 5:
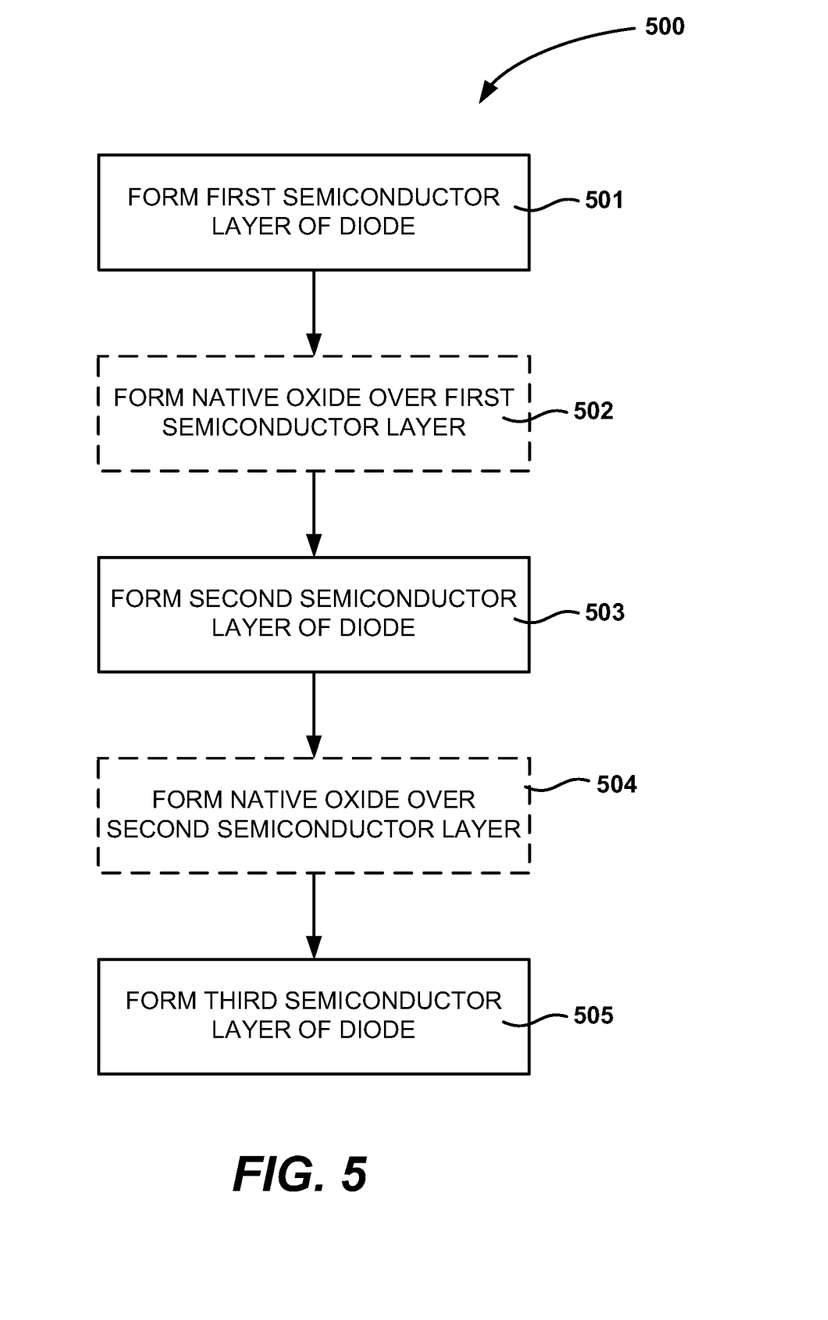
FIG. 5 illustrates a method for forming diodes having one or more native oxide layers in accordance with embodiments of the present invention.

FIG. 5 illustrates a method 500 for forming diodes having one or more native oxide layers in accordance with embodiments of the present invention. With reference to FIG. 5, in step 501, a first semiconductor layer is formed above a substrate. For example, a p+ or n+ silicon, germanium, silicon-germanium or other semiconductor layer may be formed above a substrate. In some embodiments, the first semiconductor layer may have a thickness of about 40 to about 1000 angstroms, preferably about 50-100 angstroms, with a doping concentration of about $10^{21}$ cm$^{-3}$. Other thicknesses and/or doping concentrations may be used.

In step 502, if desired, a native oxide layer may be formed over the first semiconductor layer. For example, a native oxide layer may be formed by exposing the first semiconductor layer to an oxidizing species, either within a silicon deposition or other chamber or by exposing the first semiconductor layer to room conditions.

As an example, the native oxide layer may have a thickness of about 25 angstroms or less, in some embodiments about 1 to 20 angstroms, and in some embodiments about 10-14 angstroms. Other native oxide layer thicknesses may be used.

In step 503, a second semiconductor layer is formed above the first semiconductor layer (and native oxide layer if present). For example, an intrinsic, p− or n− silicon, germanium, silicon-germanium or other semiconductor layer may be formed above the first semiconductor layer. In at least one embodiment, the second semiconductor layer may be about 500 to about 4800 angstroms, and in some embodiments about 750 angstroms, in thickness. Other layer thicknesses may be used.

In step 504, if desired, a native oxide layer may be formed over the second semiconductor layer. For example, a native oxide layer may be formed by exposing the second semiconductor layer to an oxidizing species, either within a silicon deposition or other chamber or by exposing the second semiconductor layer to room conditions.

In at least one embodiment, the native oxide layer may have a thickness of about 25 angstroms or less, in some embodiments about 1 to 20 angstroms, and in some embodiments about 10-14 angstroms. Other native oxide layer thicknesses may be used. However, when a native oxide layer is formed above both the first and second semiconductor layers, in some embodiments, the total thickness of both native oxide layers may be about 25 angstroms or less, in some embodiments about 1 to 20 angstroms, and in some embodiments about 10-14 angstroms. Other total native oxide layer thicknesses may be used. The native oxide layers may have the same, similar or different thicknesses and may be continuous or discontinuous films.

In step 505, a third semiconductor layer is formed above the second semiconductor layer (and native oxide layer if present). For example, an n+ or p+ silicon, germanium, silicon-germanium or other semiconductor layer may be formed above the second semiconductor layer. In some embodiments, the third semiconductor layer may have a thickness of about 40 to about 1000 angstroms, and in some embodiments about 50-100 angstroms, with a doping concentration of about $10^{21}$ cm$^{-3}$. Other thicknesses and/or doping concentrations may be used.

Exemplary Memory Cells Employing Diodes with Native Oxides

Figure 6A:
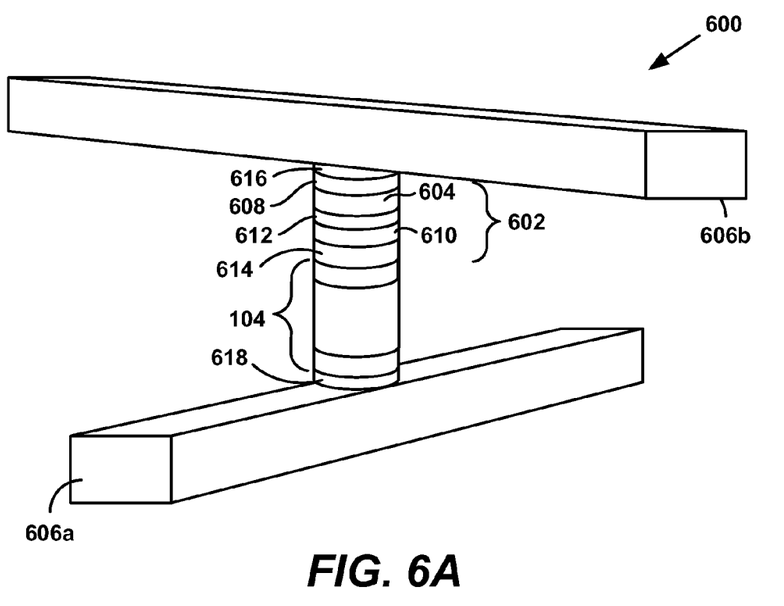
FIG. 6A is a schematic illustration of another exemplary memory cell in accordance with this invention.

FIG. 6A is a simplified perspective view of an exemplary embodiment of a memory cell 600 in accordance with this invention. Memory cell 600 includes a metal-insulator-metal (MIM) stack 602 (having reversible resistivity-switching (RRS) material 604) coupled in series with diode 104 between a first conductor 606a and a second conductor 606b.

MIM stack 602 may serve as a reversible resistance-switching element for the memory cell 600. The MIM stack 602 may be any suitable MIM stack, and may include a top conducting layer 608 and a bottom conducting layer 610 that surround RRS material 604 and serve as top and bottom electrodes for the MIM stack 602.

In some embodiments, the RRS material 604 may be a metal oxide such as $HfO_x$, $ZrO_x$, $NiO_x$, $TiO_x$, $TaO_x$, $NbO_x$, $Al_xO_y$, or another metal oxide ($MO_x$) layer. One or more additional layers 612 such as a metal layer, a metal oxide layer, a metal/metal oxide layer stack, or the like, may be employed within the MIM stack 602 to improve switching performance as described, for example, in U.S. patent application Ser. No. 12/904,770, filed Oct. 14, 2010, titled "BIPOLAR STORAGE ELEMENTS FOR USE IN MEMORY CELLS AND METHODS OF FORMING THE SAME" which is hereby incorporated by reference herein in its entirety for all purposes.

In other embodiments, the RRS material 604 may be graphitic carbon, graphene, graphite, carbon nano-tubes, amorphous DLC, silicon carbide, boron carbide or other crystalline forms of carbon, which may include secondary materials.

In some embodiments, a barrier layer 614 may be formed between MIM stack 602 and diode 104, and a barrier layer 616 may be formed between MIM stack 602 and second conductor 606b. An additional barrier layer 618 may be formed between diode 104 and first conductor 606a. Barrier layers 614, 616 and 618 may include titanium, titanium nitride, tantalum, tantalum nitride, tungsten, tungsten nitride, molybdenum, combinations of the same, or another similar barrier layer. Barrier layer 616 may be separate from or part of second conductor 606b and barrier layer 618 may be separate from or part of first conductor 606a.

Diode 104 may include any of the diodes 104a-i (e.g., with one or more native oxide layers) described herein, or any other suitable diode.

Figure 6B:
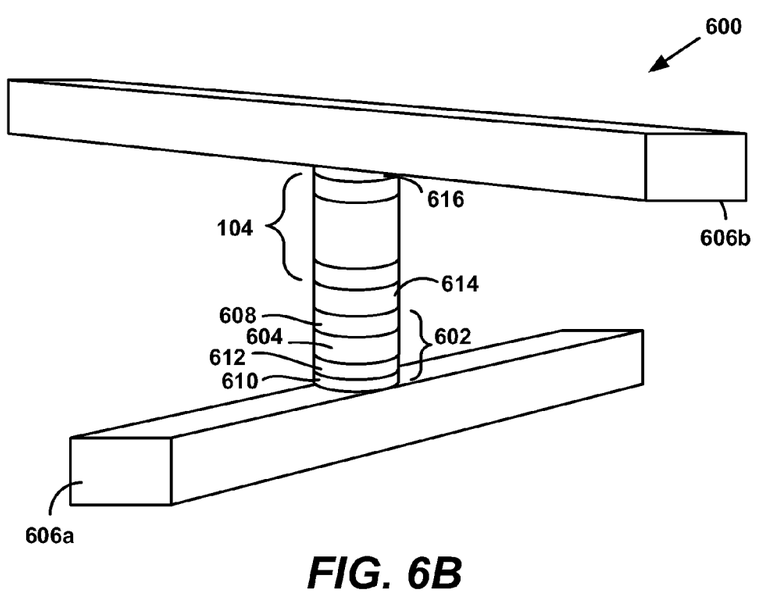
FIG. 6B is a simplified perspective view of yet another exemplary embodiment of a memory cell in accordance with this invention.

In the embodiment of FIG. 6A, the MIM stack 602 is positioned above diode 104. However, as shown in FIG. 6B, the MIM stack 602 alternatively may be positioned below the diode 104. In yet other embodiments, diode 104 may be located remotely from the MIM stack 602 (e.g., not between first and second conductors 606a and 606b).

First conductor 606a and/or second conductor 606b may include any suitable conductive material such as tungsten, any appropriate metal, heavily doped semiconductor material, a conductive silicide, a conductive silicide-germanide, a conductive germanide, highly conductive carbon or the like. In the embodiment of FIG. 6A, first and second conductors 606a and 606b, respectively, are line or rail-shaped and extend in different directions (e.g., substantially perpendicular to one another). Other conductor shapes and/or configurations may be used. In some embodiments, barrier layers, adhesion layers, antireflection coatings and/or the like (not shown) may be used with first conductor 606a and/or second conductor 606b to improve device performance and/or aid in device fabrication.

Figure 6C:
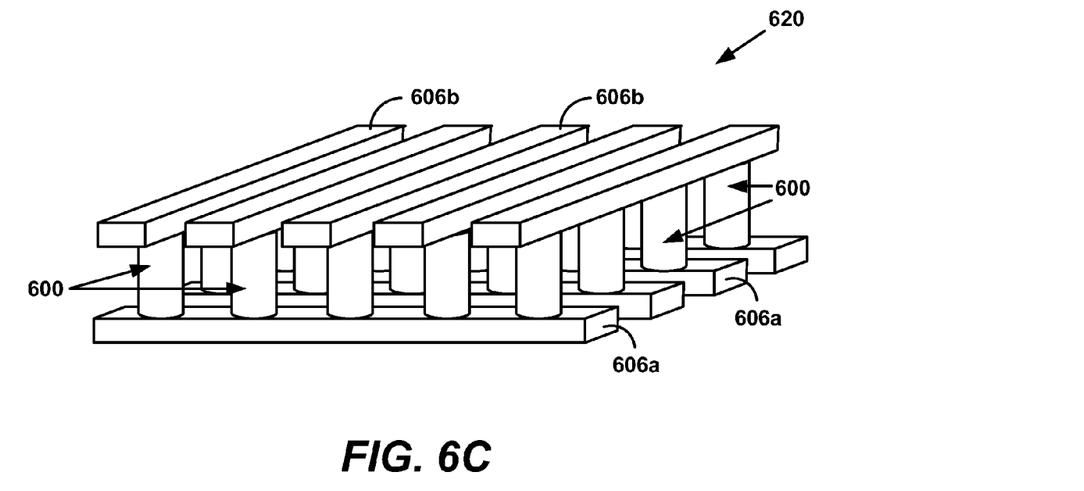
FIG. 6C is a simplified perspective view of a portion of a first memory level formed from a plurality of memory cells in accordance with this invention.

FIG. 6C is a simplified perspective view of a portion of a first memory level 620 formed from a plurality of memory cells 600, such as memory cells 600 of FIG. 6A or 6B. For simplicity, RRS material 604, conductive layers 608 and 610, additional layer(s) 612, diode 104, and barrier layers 614, 616 and 618 are not separately shown. Memory array 620 is a "cross-point" array including a plurality of bit lines (second conductors 606b) and word lines (first conductors 606a) to which multiple memory cells are coupled (as shown). Other memory array configurations may be used, as may multiple levels of memory.

Figure 6D:
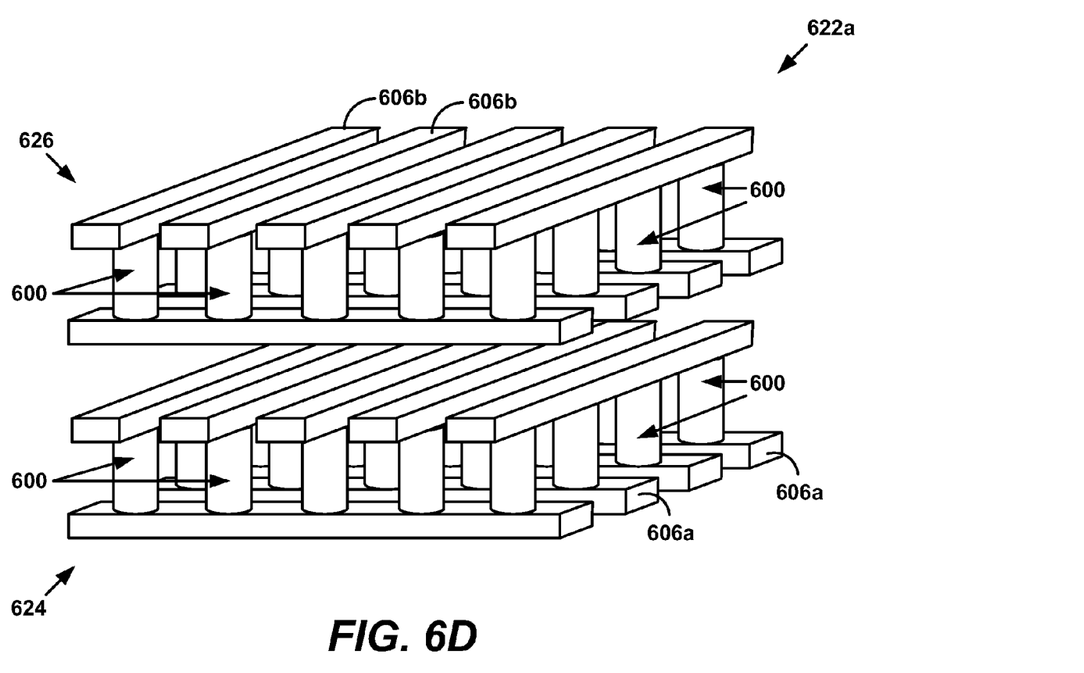
FIG. 6D is a simplified perspective view of a portion of a first monolithic three dimensional memory array that includes a first memory level positioned below a second memory level in accordance with the present invention.

FIG. 6D is a simplified perspective view of a portion of a monolithic three dimensional memory array 622a that includes a first memory level 624 positioned below a second memory level 626. Memory levels 624 and 626 each include a plurality of memory cells 600 in a cross-point array. Persons of ordinary skill in the art will understand that additional layers (e.g., an interlevel dielectric) may be present between first and second memory levels 624 and 626, but are not shown in FIG. 6D for simplicity. Other memory array configurations may be used, as may additional levels of memory.

In the embodiment of FIG. 6D, when a bipolar steering element such as a p-i-n diode is employed within each memory cell 600, all diodes may "point" in the same direction, such as upward or downward depending on whether p-i-n diodes having a p-doped region on the bottom or top of the diodes are employed, simplifying diode fabrication.

Figure 6E:
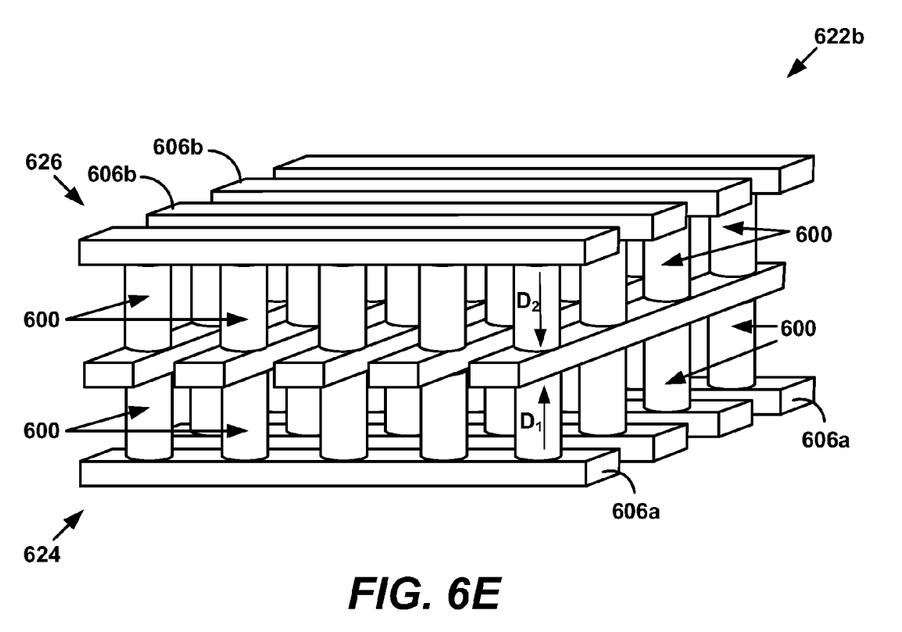
FIG. 6E is a simplified perspective view of a portion of a second monolithic three dimensional memory array that includes a first memory level positioned below a second memory level in accordance with the present invention.

In some embodiments, the memory levels may be formed as described in U.S. Pat. No. 6,952,030, titled "High-Density Three-Dimensional Memory Cell," which is hereby incorporated by reference herein in its entirety for all purposes. For instance, the second (top) conductors of a first memory level may be used as the first (bottom) conductors of a second memory level that is positioned above the first memory level as shown in FIG. 6E. In such embodiments, the diodes on adjacent memory levels may point in opposite directions as described in U.S. patent application Ser. No. 11/692,151, filed Mar. 27, 2007 and titled "Large Array Of Upward Pointing P-I-N Diodes Having Large And Uniform Current" (the "'151 application"), which is hereby incorporated by reference herein in its entirety for all purposes. For example, as shown in memory array 622b in FIG. 6E, the diodes of first memory level 624 may be upward pointing diodes as indicated by arrow D1 (e.g., with p regions at the bottom of the diodes), whereas the diodes of second memory level 626 may be downward pointing diodes as indicated by arrow D2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Accordingly, although the present invention has been disclosed in connection with exemplary embodiments thereof, it should be understood that other embodiments may fall within the spirit and scope of the invention, as defined by the following claims.

The invention claimed is:

1. A vertical semiconductor diode comprising:
   a first semiconductor layer formed above a substrate;
   a second semiconductor layer formed above the first semiconductor layer;
   a first native oxide layer formed between the first and second semiconductor layers;
   a third semiconductor layer formed above the first semiconductor layer, second semiconductor layer and first native oxide layer so as to form the vertical semiconductor diode that includes the first native oxide layer; and
   a second native oxide layer formed between the second and third semiconductor layers.

2. The diode of claim 1 wherein the first semiconductor layer comprises n+ semiconductor material, the second semiconductor layer comprises intrinsic or undoped semiconductor material, and the third semiconductor layer comprises p+ semiconductor material.

3. The diode of claim 1 wherein the first semiconductor layer comprises p+ semiconductor material, the second semiconductor layer comprises intrinsic or undoped semiconductor material, and the third semiconductor layer comprises n+ semiconductor material.

4. The diode of claim 1 wherein the first native oxide layer comprises $Si_xO_y$.

5. The diode of claim 1 wherein the first native oxide layer is a continuous layer.

6. The diode of claim 1 wherein the first native oxide layer is discontinuous.

7. The diode of claim 1 wherein the first native oxide layer has a thickness of less than about 25 angstroms.

8. The diode of claim 1 wherein the first native oxide layer has a thickness of about 1 to 20 angstroms.

9. The diode of claim 1 wherein the first native oxide layer has a first thickness T1 and the second native oxide layer has a second thickness T2 and wherein T1+T2≤25 angstroms.

10. The diode of claim 9 wherein T1+T2≤20 angstroms.

11. A memory cell comprising:
a first conductive layer formed above a substrate;
a storage element formed above the first conductive layer;
a vertical semiconductor diode formed above the first conductive layer, the vertical semiconductor diode having:
  a first semiconductor layer formed above the first conductive layer;
  a second semiconductor layer formed above the first semiconductor layer;
  a first native oxide layer formed between the first and second semiconductor layers;
  a third semiconductor layer formed above the first semiconductor layer, second semiconductor layer and first native oxide layer so as to form the vertical semiconductor diode that includes the first native oxide layer; and
  a second native oxide layer formed between the second and third semiconductor layers; and
a second conductive layer formed above the first conductive layer, the storage element and the vertical semiconductor diode.

12. The memory cell of claim 11 wherein the storage element comprises a metal-insulator-metal (MIM) stack including:
a first conducting layer;
a reversible resistivity switching (RRS) layer formed above the first conducting layer; and
a second conducting layer formed above the RRS layer.

13. The memory cell of claim 12 wherein the RRS layer comprises a metal oxide or a carbon-based switching material.

14. The memory cell of claim 11 wherein the first native oxide layer comprises $Si_xO_y$.

15. The memory cell of claim 11 wherein the first native oxide layer has a thickness of less than about 25 angstroms.

16. A method of forming a semiconductor diode comprising:
forming a first semiconductor layer above a substrate;
forming a second semiconductor layer above the first semiconductor layer;
forming a first native oxide layer between the first and second semiconductor layers;
forming a third semiconductor layer above the first semiconductor layer, second semiconductor layer and first native oxide layer so as to form the semiconductor diode that includes the first native oxide layer; and
forming a second native oxide layer between the second and third semiconductor layers.

17. The method of claim 16 wherein forming the first native oxide layer comprises exposing the substrate to an oxidizing species.

18. The method of claim 17 wherein forming the first semiconductor layer comprises forming the first semiconductor layer in a deposition chamber and wherein exposing the substrate to the oxidizing species occurs within the deposition chamber.

19. The method of claim 17 wherein forming the first semiconductor layer comprises forming the first semiconductor layer in a deposition chamber and wherein exposing the substrate to the oxidizing species occurs outside of the deposition chamber.

20. The method of claim 16 wherein the first native oxide layer comprises $Si_xO_y$.

21. The method of claim 16 wherein the first native oxide layer has a thickness of less than about 25 angstroms.

22. The method of claim 16 wherein the first native oxide layer has a first thickness T1 and the second native oxide layer has a second thickness T2 and wherein T1+T2≤25 angstroms.

23. A method of forming a memory cell comprising:
forming a first conductive layer above a substrate;
forming a storage element above the first conductive layer;
forming a vertical semiconductor diode above the first conductive layer by:
  forming a first semiconductor layer above the first conductive layer;
  forming a second semiconductor layer above the first semiconductor layer;
  forming a first native oxide layer between the first and second semiconductor layers;
  forming a third semiconductor layer above the first semiconductor layer, second semiconductor layer and first native oxide layer so as to form the vertical semiconductor diode that includes the first native oxide layer; and
  forming a second native oxide layer between the second and third semiconductor layers; and
forming a second conductive layer above the first conductive layer, the storage element and the vertical semiconductor diode.

24. The method of claim 23 wherein forming the first native oxide layer comprises exposing the substrate to an oxidizing species.

25. The method of claim 24 wherein forming the first semiconductor layer comprises forming the first semiconductor layer in a deposition chamber and wherein exposing the substrate to the oxidizing species occurs within the deposition chamber.

26. The method of claim 24 wherein forming the first semiconductor layer comprises forming the first semiconductor layer in a deposition chamber and wherein exposing the substrate to the oxidizing species occurs outside of the deposition chamber.

27. The method of claim 23 wherein the storage element comprises a metal-insulator-metal (MIM) stack including:
a first conducting layer;
a reversible resistivity switching (RRS) layer formed above the first conducting layer; and
a second conducting layer formed above the RRS layer.

28. The method of claim 27 wherein the RRS layer comprises a metal oxide or a carbon-based switching material.

* * * * *